United States Patent
Watanabe

(10) Patent No.: US 6,420,222 B1
(45) Date of Patent: Jul. 16, 2002

(54) METHOD OF PRODUCING SEMICONDUCTOR HAVING TWO-LAYER POLYCRYSTALLINE SILICON STRUCTURE

(75) Inventor: Hitomi Watanabe, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/047,859

(22) Filed: Mar. 25, 1998

(30) Foreign Application Priority Data

Mar. 27, 1997 (JP) .............................................. 9-076280

(51) Int. Cl.⁷ ......................................... H01L 21/8238
(52) U.S. Cl. ........................ 438/201; 438/211; 438/258
(58) Field of Search ................................ 257/296, 306, 257/311, 319, 314–316, 328, 335, 532; 438/201, 202, 211, 234, 258, 257, 264, 265, 266

(56) References Cited

U.S. PATENT DOCUMENTS

| | | | | |
|---|---|---|---|---|
| 4,830,974 A | * | 5/1989 | Chang et al. ................ | 438/201 |
| 4,833,096 A | * | 5/1989 | Huang et al. ................ | 438/201 |
| 5,273,923 A | * | 12/1993 | Chang et al. ................ | 438/264 |
| 5,286,991 A | * | 2/1994 | Hui et al. .................... | 257/306 |
| 5,445,987 A | * | 8/1995 | Kuroda et al. ............... | 438/257 |
| 5,801,416 A | * | 9/1998 | Choi et al. ................... | 257/335 |
| 5,894,147 A | * | 4/1999 | Cacharrlis .................... | 257/316 |

* cited by examiner

Primary Examiner—Olik Chaudhuri
Assistant Examiner—Hoai Pham
(74) Attorney, Agent, or Firm—Adams & Wilks

(57) ABSTRACT

In a semiconductor manufacturing process for a semiconductor device having two layers of polycrystalline silicon and a Double Diffused Drain (DDD) type transistor, the number of heat treatment processes is minimized to avoid degrading the quality of a gate oxide film, such as a tunnel oxide film in an EEPROM. After forming a gate electrode of a DDD transistor and a lower electrode of a capacitor, for example, of a first polycrystalline silicon film, a DDD impurity diffusion region is formed by a heat treatment process combined with a thermal oxide growth process for producing an oxide dielectric for the capacitor and a gate oxide of a peripheral transistor. A second polycrystalline silicon film is then formed as a gate electrode of the peripheral transistor and an upper electrode of the capacitor, thereby reducing the number of process steps and improving the quality of the gate oxide film and a tunnel oxide film by reducing the length of the heat treatment processes.

19 Claims, 4 Drawing Sheets

Fig.2.B

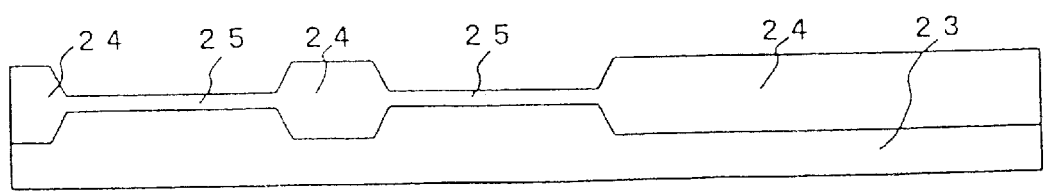
Fig. 3A  PRIOR ART
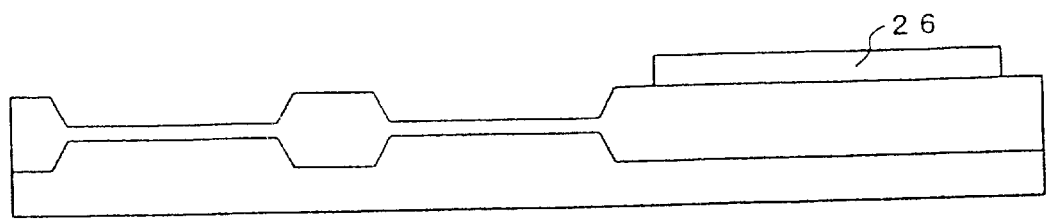
Fig. 3B  PRIOR ART
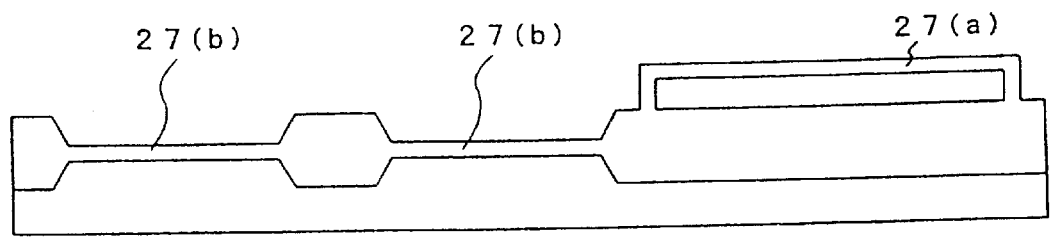
Fig. 3C  PRIOR ART
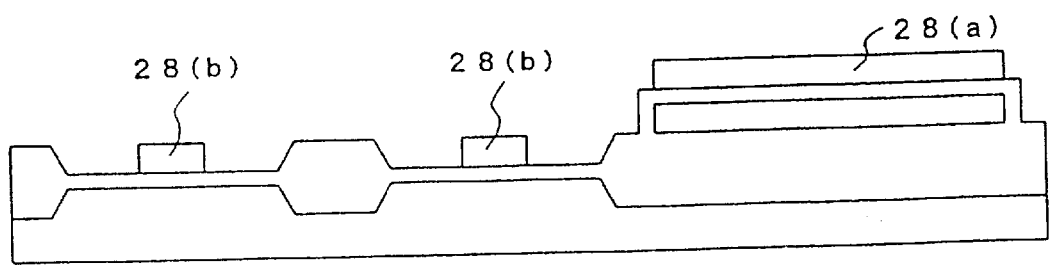
Fig. 3D  PRIOR ART

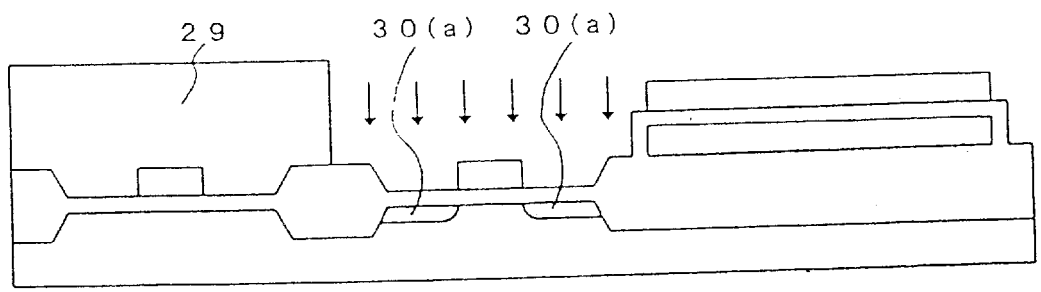
Fig.3.E  PRIOR ART
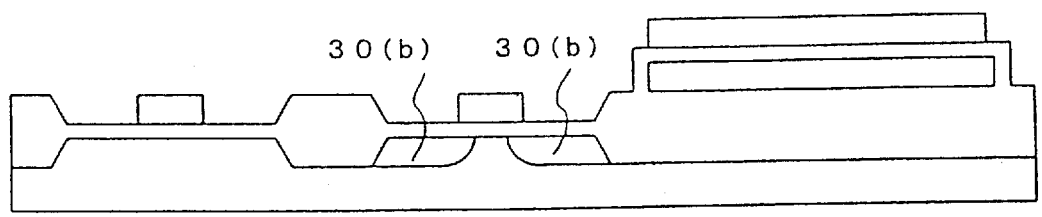
Fig.3F  PRIOR ART
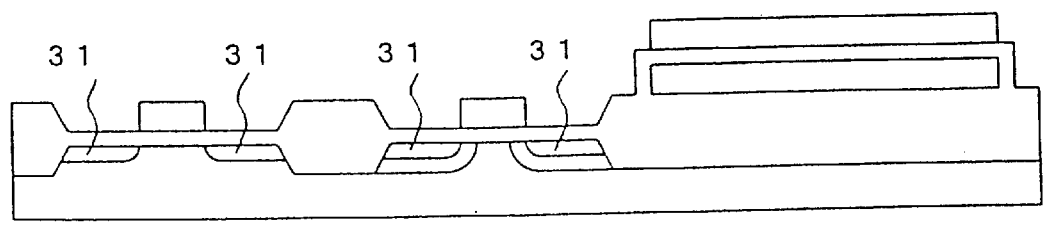
Fig.3G  PRIOR ART

METHOD OF PRODUCING SEMICONDUCTOR HAVING TWO-LAYER POLYCRYSTALLINE SILICON STRUCTURE

BACKGROUND OF THE INVENTION

The present invention relates to a semiconductor device and a method of manufacturing the same, and more particularly to a structure of a high withstand voltage MOS transistor that is manufactured through a process of forming two polycrystalline silicon layers, a structure of a semiconductor device utilizing the high withstand voltage MOS transistor, and methods of manufacturing the same.

Conventionally, the process given hereinbelow has been utilized for forming DDD (Double-Diffused Drain) type MOS transistors and other types of MOS transistors by using two polycrystalline silicon layers on a semiconductor substrate.

First, a device isolating film 24 and an oxidized film 25 are formed on a silicon substrate 23 by a known technique, as shown in FIG. 3A.

Then, as shown in FIG. 3B, after forming first polycrystalline silicon film by a known technique, the film is patterned and etch-removed to form a lower electrode 26 for a capacitance element. Then, formed are an insulating oxidized film 27 (a) on the lower electrode 26 and a gate oxidized film 27(b) by thermal oxidation, as shown in FIG. 3C. Then, a second polycrystalline silicon film is formed by a known technique as shown in FIG. 3D, and thereafter patterned and removed by etching to form an upper electrode 28 (a) for a capacitance element and a gate electrode 28(b) for a transistor. Then, as shown in FIG. 3E, a photoresist material 29 is patterned by a known technique to selectively form by a known technique an impurity layer 30(a) for a DDD at a transistor region to be formed with a DDD structure.

Then, as shown in FIG. 3F, a DDD diffusion layer 30 (b) is formed by a thermal diffusion process in order to obtain a diffusion width so that the impurity layer 30 (a) can function as a DDD. Then, as shown in FIG. 3G, source and drain layers 31 are formed in the transistor region by a known technique to thereby forming a DDD transistor and a capacitance element or other types of transistors.

In the conventional manufacturing method, there has been a problem as described below because of forming gate electrodes of the DDD transistor and the other types of transistors by the same polycrystalline silicon.

1. The number of manufacturing processes is great due to the necessity of the thermal diffusion process for sufficiently diffusing the DDD diffusion layer.

2. Since the thermal diffusion process is of a process conducted at a comparatively high temperature, there is deterioration in film properties of the insulating oxidized film, the gate. oxidized film and the like that has been formed prior to the thermal diffusion process.

3. There is difficulty in changing the gate oxidized film thickness for the DDD transistor and the other transistors. In order to carry out this requirement, there is a necessity for many more processes.

It is the purpose of the present invention to improve the conventional, structure and manufacturing method to eliminate, the above-stated problem.

SUMMARY OF THE INVENTION

In the structure and the manufacturing method of the present invention, after forming a gate of a DDD transistor and a lower electrode of a capacitance element by a first polycrystalline silicon, film and a DDD impurity layer is formed so that a DDD transistor is formed through a common thermal oxidation process and a DDD impurity diffusion process so as to form an insulating oxidized film for a capacitance element and a gate oxidized film for a transistor having a second polycrystalline silicon film as a gate electrode. Therefore the method has operational effects given as follows:

1. Manufacturing processes are reduced in number.

2. The reduction of heat treating processes improves the quality of the insulating oxidized film and the gate oxidized film.

3. Since the gate oxidation can be separately made between the DDD transistor and the other transistors, the thickness of, each of the gate oxidized films is easy to change.

BRIEF DESCRIPTION OF THE DRAWINGS

FIGS. 2A–2D is an explanatory view of a second embodiment of the present invention;

FIGS. 3A–3G is an explanatory view of a conventional technique.

DETAILED DESCRIPTION

Now explanations will be made hereinbelow of a first embodiment of the present invention.

Figure 1A:
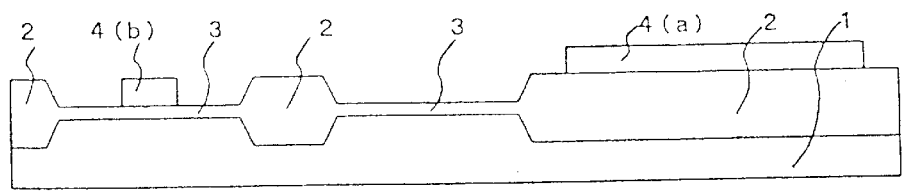
FIGS. 1A–1E is an explanatory view of a first embodiment of the present invention.
Figure 1B:
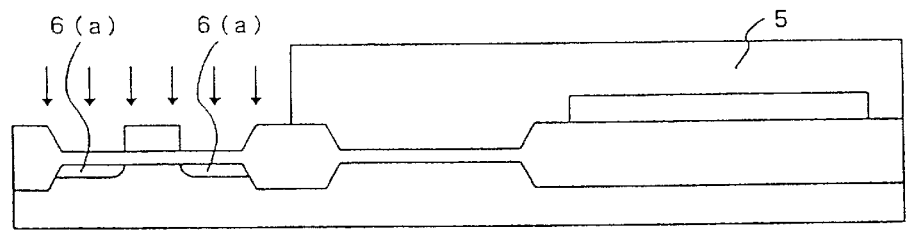

First, as shown in FIG. 1A, an isolating film 2, a first gate oxidized film 3, and a first polycrystalline silicon film of a capacitance element lower electrode 4(a) and a first transistor gate electrode 4(b) are formed on a silicon substrate 1 by a known technique. Then, as shown in FIG. 1B, a photoresist material 5 is patterned by a known technique to selectively form an impurity layer 6(a) for a DDD in a first transistor region for example through an ion implantation method using phosphorus.

Figure 1C:
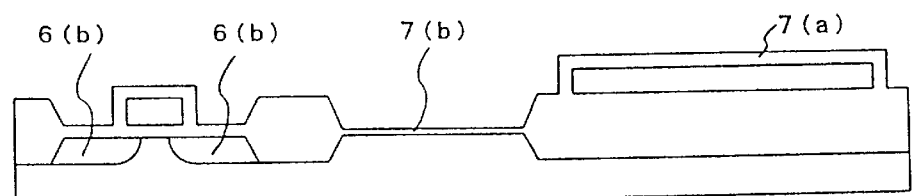
Figure 1D:
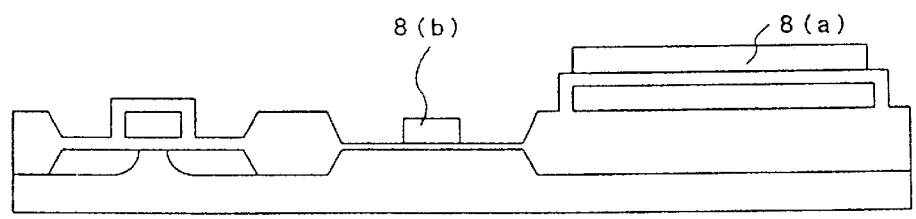

Then, as shown in FIG. 1C, if required, the first gate oxidized film 3 on a second transistor region is removed, and thereafter an insulating oxidized film 7(a) for a capacitance element and a second gate oxidized film 7(b) for a second transistor are formed through thermal oxidation. The thermal diffusion process used at this time causes the previously formed impurity layer 6(a) to be diffused, thereby forming a DDD diffusion layer 6(b). Then, as shown in FIG. 1D, an upper electrode 8(a) for a capacitance element and a gate electrode 8(b) for a second transistor are formed of second polycrystalline silicon by the known technique.

Figure 1E:
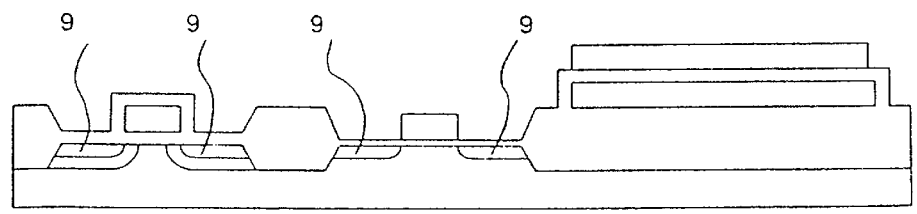

Then, as shown in FIG. 1E, source and drain diffusion layers 9 are formed in the first and second transistor regions by the known technique to thereby form a DDD transistor and a capacitance element or other type transistors.

The DDD transistor thus formed has its gate electrode of the first polycrystalline silicon so that it can utilize, also as a thermal treatment process for the DDD diffusion, the gate oxidation for the second transistor having the gate electrode of the second polycrystalline silicon and the oxidation process for forming the insulating film of the capacitance element, thus omitting a DDD thermal diffusing process. Here, it is needless to say that the similar functions and effects are available for the cases described below, without limited to the case that the first embodiment employs two polycrystalline silicon layers to form the DDD transistor, the other type transistor and the capacitance element.

1. where forming a DDD transistor and other type transistors by using two polycrystalline silicon layers.

2. where forming a DDD transistor and a capacitance element by using two polycrystalline silicon layers.

Explanation will be made hereinbelow on a second embodiment wherein the first embodiment is applied to a EEPROM.

The EEPROM has a peripheral circuit that may satisfactorily operable on a power voltage range, for example, of 10 V or below, an EEPROM cell array section, and a high-voltage drive circuit section that may satisfactorily operable on voltages, for example, of 14–30 V normally higher than the power voltage.

Consequently, high withstand voltage transistors are required for the EEPROM cells and high voltage drive circuit sections where high voltage are applied for writing-in. In order to achieve a higher withstand voltage, it is preferred that not only the transistor source and drain portions are made in a DDD structure but also the thickness of the transistor gate oxidized film is formed comparatively thick.

For the peripheral circuit section, there is no especial necessity of high withstand transistors. Considering drivability or current leakage, the EEPROM is improved in performance by thinning the gate film thickness of the transistors for the peripheral circuit section. That is, it is preferred that the structure of the source and the drain as well as the gate oxide thickness are different between the high withstand transistor and the peripheral circuit transistor.

Also, the EEPROM cell has a tunnel oxide region, as a carrier moving port for writing-in, whose oxidized film has a thickness considerably thinner than that of a gate oxidized film of the usual transistor. Accordingly, the quality of the film deteriorates as the heat treatment after formation thereof becomes longer, resulting in lowering of the dielectric strength due to an increase in traps, interface order or the like. Therefore, the heat treatment process should be preferably made as short as possible.

Figure 2A:
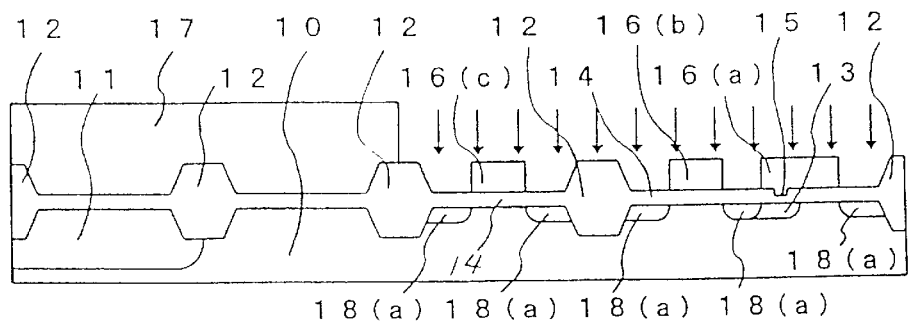

As shown in FIG. 2A, first formed by known technique on a silicon substrate 10 are a well region 11, device isolation film 12, a tunnel drain diffusion layer 13, a first gate oxidized film 14, a tunnel oxidized film region 15, a first polycrystalline silicon gate electrode 16 (a) of a floating gate transistor, a first polycrystalline silicon gate electrode 16(b) of a select gate transistor, a gate electrode 16(c) of a high withstand voltage transistor, and so on. A photoresist material 17 is patterned to implement ion implantation in regions requiring high withstand voltage such as a cell array region and high voltage driving circuit, thereby forming an impurity layer 18(a) for providing a DDD.

It is needless to say herein in which there may be a case that the impurity layer 18 (a) for the DDD is satisfactorily formed at least on the drain side of the select gate transistor in the EEPROM cell. At this time, for example, the silicon substrate 10 is a P-type, the drain region 11 is an N-type, the tunnel drain 13 is an N-type, and the first gate oxidized film 14 is formed with a thickness of 300–1200 Å, whereas the tunnel oxidized film 15 is formed with a thickness in the range of 50–150 Å.

The first polycrystalline silicon film is utilized not only for the electrode of the floating gate electrode but for the select gate electrode, a gate electrode of the high withstand voltage transistor, and interconnects. Accordingly, it is preferable to form it with a film thickness of 2500–6000 angstroms and a sheet resistance value of 10–500 Ω/sq.

Further, the impurity layer 18(a) is preferably formed by implanting phosphorus at 1E13–8E14 atms/cm$^2$.

Then, as shown in FIG. 2B, after removing, if required the first gate oxidized film of the second polycrystalline silicon film as a gate electrode on the peripheral circuit transistor region, an insulating oxidized film 19(a) for capacitance-coupling of a control gate electrode to be formed by thermal oxidation as described below and the floating gate electrode 16(a), is formed and a second gate oxidized film 19(b) used for a peripheral circuit transistor having a second polycrystalline silicon film as a gate electrode.

Simultaneously, the impurity layer 18(a) previously formed is diffused through the above-mentioned thermal oxidation process, thus resulting in formation of a DDD diffusion layer 18(b). As explained hereinbefore, it is preferred to form the film thickness of the gate oxidized film 19(a) for the peripheral circuit transistor as thick as possible. It is also preferred to form the insulating oxidized film 19(a) for capacitance-coupling between the floating gate electrode and the control gate electrode by using a high quality oxidized film to be formed by thermal oxidation at comparatively high temperatures, because it is applied by a high electric voltage during writing-in the EEPROM.

Therefore, in the embodiment of the present invention, after removing the gate oxide film 14 on the peripheral circuit transistor, thermal oxidation for forming the insulating oxidized film 19(a) for the capacitance element and the second gate oxide film 19(b) is carried out by processing in a dry oxygen atmosphere, e.g. solely oxygen or a mixed atmosphere of oxygen and nitrogen, at a temperature of 1000–1100° C. It is preferred that the film thickness of the gate oxide film 19(a) of the peripheral transistor is thinner, e.g. 150–400 angstroms, than the gate oxidized film thickness of the high withstand voltage transistor.

If the conditions of the thermal oxidation are as stated above, the impurity layer 18(a) will have a diffusion width for functioning as a DDD.

Figure 2C:
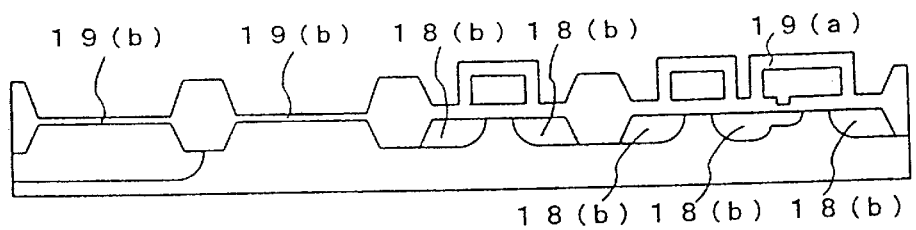
Figure 2C:
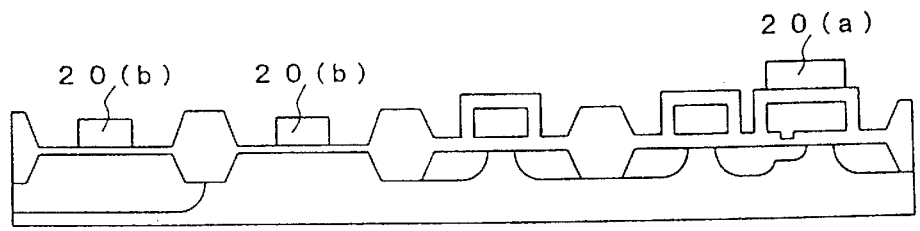

Then, as shown in FIG. 2C, a control gate electrode 20(a) for a EEPROM cell and a gate electrode 19(b) for a peripheral transistor are formed by using second polycrystalline silicon film through the known technique.

Figure 2D:
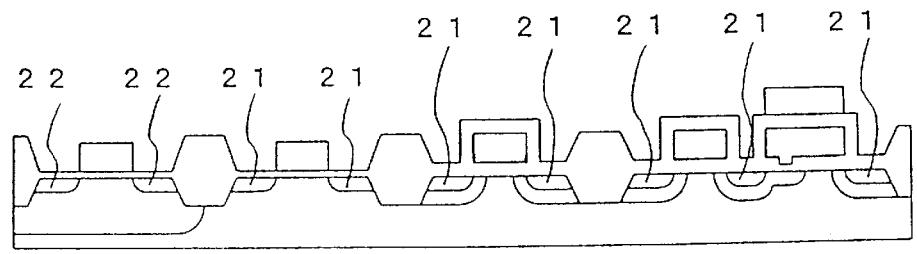

Since the second polycrystalline silicon film at this time is also utilized for a control gate electrode, a gate electrode for a peripheral transistor and interconnects, it is preferably formed to have a film thickness of 2500–6000 angstroms and a sheet resistance of 10–500 Ω/sq. Then, as shown in FIG. 2D, source and drain diffusion layers 21 in a first conductivity type, e.g. P-type, and source and drain diffusion layers 22 in a second conductivity type, e.g. N-type arsenic, are formed by the known technique, to thereby form an EEPROM cell having a DDD transistor as its select gate and other kinds of circuits.

In the structure of FIG. 2 at this time, where a C-MOS circuit of a DDD structure is formed in the high withstand voltage driving circuit section, it is needless to say that, before forming the second gate oxide layer 19(a) shown in FIG. 2(b) and the capacitance insulating film 19(b), a transistor region having as a gate electrode a first polycrystalline silicon film layer with an impurity layer in reverse conductivity to the impurity layer 18(a) may be formed to provide a DDD diffusion layer through thermal oxidation for forming the oxidized film 19(a) and the oxidized film 19(b).

Conventionally, since the floating gate electrode only has been formed by the first polycrystalline silicon film and the peripheral circuit transistor, the DDD transistor and the control gate electrode have been formed by the second polycrystalline silicon film, there have been necessities of the oxidation processes for respective gates, in addition to the oxidation for forming the capacitance insulating film, because of varying if necessary the oxidation film thickness of between the high withstand voltage transistor and the peripheral circuit transistor.

In the EEPROM formed as above, however, the DDD transistor has its gate electrode of the first polycrystalline silicon film and the peripheral circuit transistor has its gate electrode of the second polycrystalline silicon film. It is therefore possible to carry out, through just once thermal oxidation process, the thermal oxidation process for the gate oxidation process by the second polycrystalline silicon film for the peripheral circuit transistor and the thermal oxidation process for forming the insulating film between the floating gate electrode and the control gate electrode, and it can be used also as a thermal process for diffusing the DDD, so that the two processes, i.e. the gate oxidation process of the peripheral transistor and the thermal diffusion process of the DDD can be omitted.

As explained hereinabove, in the present invention, since the DDD transistor has first polycrystalline silicon film as a gate electrode thereof, it is possible to commonly carry out the thermal oxidation process on the gate oxidation for a second transistor having second polycrystalline silicon film as a gate electrode thereof and the thermal oxidation process of forming a capacitor element insulating oxidized film and the heat treatment for the DDD diffusion. Thus, the processes are reduced to thereby reduce manufacturing cost.

Particularly in the EPROM, since the DDD transistor has first polycrystalline silicon film as its gate electrode and the peripheral circuit transistor has second polycrystalline silicon film as its gate electrode; one time of oxidation process can be effected for the gate oxidation process for the peripheral circuit transistor having the second polycrystalline silicon film as its gate electrode and the thermal oxidation process for forming an insulating oxidized film between a floating gate and a control gate, which can also be utilized for the heat treatment process for DDD diffusion. Consequently, the two processes of the gate oxidation process for the peripheral circuit transistor and the thermal diffusion process for DDD are omitted so that it is possible to easily form transistors different in gate oxidized film thickness between the high withstand voltage circuit section and the peripheral circuit section.

Therefore, the manufacturing cost can be reduced by reducing the processes. The EEPROM can be improved of performance. Moreover, the omission of two thermal oxidation processes serves to suppress the traps into a tunnel oxide and the increase of phase boundary levels, improving the oxidized film quality. Thus, the EEPROM cell has an increased lifetime of rewriting, etc., improving the reliability thereof.

What is claimed is:

1. A method for manufacturing a semiconductor device having two layers of polycrystalline silicon film, comprising the steps of: forming a first gate oxide film on a silicon substrate; forming a first polycrystalline silicon film layer on the first gate oxide film; patterning and etching the first polycrystalline silicon film layer to form a gate electrode of a DDD type MOS transistor; performing ion implantation with phosphorous to form an impurity layer in the substrate after patterning and etching the first polycrystalline silicon film layer; performing a heat treatment process at 1000° C.–1100° C. to diffuse the impurity layer to form a DDD diffusion region of the DDD type MOS transistor, and to simultaneously form a second gate oxide film of a peripheral circuit transistor; forming a second polycrystalline silicon film layer on the second gate oxide film; and patterning and etching the second polycrystalline silicon film layer to form a gate electrode of the peripheral circuit transistor.

2. A method of producing a semiconductor device having at least one high withstand voltage transistor and a peripheral circuit having a plurality of peripheral transistors having a lower withstand voltage than the high voltage withstand transistors, comprising the steps of: forming a first gate oxide film on a silicon substrate; forming a first polycrystalline silicon film layer on the first gate oxide film; patterning and etching the first polycrystalline silicon film layer to form a gate electrode of the high withstand voltage transistor; forming an impurity layer in the semiconductor substrate after patterning and etching the first polycrystalline silicon film layer; performing a heat treatment process to diffuse the impurity layer into the substrate and to simultaneously form a second gate oxide film of the peripheral transistors by oxidation; forming a second polycrystalline silicon film layer after diffusing the impurity layer; and patterning and etching the second polycrystalline silicon layer to form gate electrodes of the peripheral transistors.

3. A method of producing a semiconductor device according to claim 2; wherein the high withstand voltage transistor has a withstand voltage of at least 14V.

4. A method of producing a semiconductor device according to claims 2; wherein the steps of forming an impurity layer and performing a heat treatment process comprise the step of forming a DDD (double diffused drain) structure.

5. A method of producing a semiconductor device according to claim 2; wherein the high withstand voltage transistor is an N-MOS transistor.

6. A method of producing a semiconductor device according to claim 2; wherein the high withstand voltage transistor has a DDD diffusion region formed with phosphorous as an impurity dopant.

7. A method of producing a semiconductor device according to claim 2; wherein the peripheral circuit further comprises a capacitor, the first polycrystalline silicon film layer comprises a lower electrode of the capacitor and the second polycrystalline silicon film layer comprises an upper electrode of the capacitor.

8. A method of producing a semiconductor device according to claim 2; wherein the impurity layer comprises at least one of a source region and a drain region of the high withstand voltage transistor.

9. A method of producing a semiconductor device according to claim 8; wherein the impurity layer is formed by ion implantation of phosphorus.

10. A method of producing a semiconductor device according to claim 2; wherein the heat treatment process comprises a thermal oxidation process for forming a gate oxide film of a peripheral transistor or a dielectric film of a capacitor having the second polycrystalline silicon layer as an electrode.

11. A method of producing a semiconductor device according to claim 10; wherein the heat treatment process is conducted at a temperature within the range of 1000° C. and 1100° C.

12. A method of producing a semiconductor device according to claim 11; wherein the heat treatment process is performed in a dry oxygen atmosphere.

13. A method of producing a semiconductor device according to claim 2; wherein the impurity is doped into the semiconductor substrate to form an impurity region of the high withstand voltage transistor; and wherein the heat treatment process comprises the step of forming a gate oxide film for the peripheral transistors at a temperature sufficient to diffuse the impurity into the substrate.

14. A method of producing a semiconductor device according to claim 13; wherein the impurity region comprises at least one of a source and a drain of the high withstand voltage transistor.

15. A method of producing a semiconductor device according to claim 14; wherein the impurity region is formed by ion implantation.

16. A method of producing a semiconductor device according to claim 14; wherein the gate oxide film for the peripheral transistors is formed by thermal oxidation.

17. A method of producing a semiconductor device according to claim 16; wherein the thermal oxidation is performed at a temperature between 1000° C. and 1100° C.

18. A method of producing a semiconductor device according to claim 17; wherein the thermal oxidation is conducted in a dry oxygen atmosphere.

19. A method of producing an EEPROM circuit having a plurality of EEPROM cells having a high withstand voltage transistor and a peripheral circuit having a plurality of peripheral transistors having a lower withstand voltage than the high withstand voltage transistors, comprising the steps of: forming a first oxide film on a semiconductor substrate; forming a first polycrystalline silicon film on the first gate oxide film; patterning and etching the first polycrystalline silicon film layer to form a gate electrode of the high withstand voltage transistor; forming an impurity layer in the semiconductor substrate after patterning and etching the first polycrystalline silicon film layer, performing a heat treatment process to diffuse the impurity layer into the substrate and to simultaneously form a second gate oxide film of the peripheral transistors by oxidation; forming a second polycrystalline silicon film layer after diffusing the impurity layer; and patterning and etching the second polycrystalline silicon film layer to form gate electrodes of the peripheral transistors.

* * * * *